United States Patent
Kang

(10) Patent No.: US 7,804,967 B2
(45) Date of Patent: Sep. 28, 2010

(54) CIRCUIT FOR PREVENTING OUTPUT OF POP NOISE

(75) Inventor: Gyung Hoon Kang, Seoul (KR)

(73) Assignee: Pantech Co., Ltd., Seoul (KR)

( * ) Notice: Subject to any disclaimer, the term of this patent is extended or adjusted under 35 U.S.C. 154(b) by 1233 days.

(21) Appl. No.: 11/375,420

(22) Filed: Mar. 13, 2006

(65) Prior Publication Data

US 2006/0238247 A1 Oct. 26, 2006

(30) Foreign Application Priority Data

Apr. 6, 2005 (KR) .................. 10-2005-0028679

(51) Int. Cl.
*H04B 15/00* (2006.01)
(52) U.S. Cl. .................. 381/94.5; 381/120; 381/123; 330/51; 330/251; 330/207 A
(58) Field of Classification Search .................. 381/59, 381/94.5, 94.6, 123, 120, 111, 116–117, 381/94.1; 330/51, 149, 207 A, 251, 207
See application file for complete search history.

(56) References Cited

U.S. PATENT DOCUMENTS

| | | | |
|---|---|---|---|
| 6,157,726 A | | 12/2000 | Carroll et al. |
| 6,937,103 B2 * | | 8/2005 | Inagaki .................. 330/297 |
| 7,092,533 B1 * | | 8/2006 | Hasegawa et al. .......... 381/94.5 |
| 7,103,189 B2 * | | 9/2006 | Ford .................. 381/123 |
| 7,161,424 B2 * | | 1/2007 | Inagaki .................. 330/51 |
| 7,463,742 B2 * | | 12/2008 | Inagaki .................. 381/94.5 |
| 2003/0058040 A1 * | | 3/2003 | Miyagaki et al. ............. 330/10 |
| 2009/0214056 A1 * | | 8/2009 | Takahata .................. 381/94.5 |

FOREIGN PATENT DOCUMENTS

| | | |
|---|---|---|
| JP | 09-098039 A | 4/1997 |
| KR | 1998-045455 A | 9/1998 |
| KR | 1999-0047527 A | 7/1999 |

* cited by examiner

*Primary Examiner*—Vivian Chin
*Assistant Examiner*—Disler Paul
(74) *Attorney, Agent, or Firm*—H.C. Park & Associates, PLC

(57) ABSTRACT

Disclosed is a circuit for preventing an output of a pop noise, which occurs from an audio amplifier when a power switch of an electronic device loading the amplifier is turned on/off. The circuit may comprises an analog switch for switching an electrical connection between an audio amplifier and a speaker, and a signal delay circuit capable of respectively delaying times that the operating states of the analog switch and the power supply are changed when the power switch is turned on/off, and it is structured such that the analog switch is already opened state at the time that the power supply is on/off. Accordingly, it is possible to prevent the pop noise from being outputted through a speaker connected to the amplifier. The circuit of the invention can be applied to a variety of electronic devices having an audio amplifier.

19 Claims, 2 Drawing Sheets

CIRCUIT FOR PREVENTING OUTPUT OF POP NOISE

CROSS-REFERENCE TO RELATED APPLICATION

This application claims priority under 35 U.S.C. §119(a) from Republic of Korea Patent Application No. 10-2005-0028679 filed on Apr. 6, 2005, the content of which is herein incorporated by reference.

BACKGROUND OF THE INVENTION

1. Field of the Invention

The present invention relates to a circuit for preventing an output of a pop noise occurring from an audio amplifier, and more particularly to a circuit for preventing an output of a pop noise, which occurs from an audio amplifier when a power switch of an electronic device loading the audio amplifier is turned on/off, from being outputted through a speaker connected to the audio amplifier.

2. Description of the Prior Art

In a variety of electronic devices having an audio amplifier, when a power supply of the device is turned on/off, there occurs a noise due to a time interval until the power supply is turned on/off. The noise may instantaneously occur in the audio amplifier due to an unstable ground. Such noise is called a pop noise. The pop noise is outputted through a speaker connected to a rear end of the audio amplifier, so that a user may feel uncomfortable.

In regard to this, an audio output circuit of a general electronic device may comprise an audio amplifier 10, a power supply 11 and a controller 12, as shown in FIG. 1. The audio amplifier 10 receives an audio signal, amplifies the received signal to a predetermined level, and then outputs the amplified signal. The power supply 11 supplies a necessary power to the audio amplifier 10, and the controller 12 outputs a control signal to control on/off states of the power supply 11.

In the conventional electronic device, when a user turns on/off the power supply using a switch (not shown), the controller 12 turns on/off the power supply 11 supplying the power to the audio amplifier 11. When the power supply 11 is turned on/off, there occurs a pop noise in the audio amplifier 10.

Specifically, as the power supply 11 is turned on, an output of the audio amplifier 10 is instantaneously increased to a direct current (DC) voltage (high level) from a ground voltage (low level). On the contrary, when the power supply 11 is turned off, the output of the audio amplifier 10 is instantaneously dropped to the ground voltage (low level) from the DC voltage (high level). As a result, there instantaneously occurs a pop noise in the audio amplifier 10 and the pop noise is outputted through a speaker (SPK). Like this, in the electronic device having the audio amplifier according to the prior art, when the power is on/off, the pop noise is outputted, so that the user feels uncomfortable.

SUMMARY OF THE INVENTION

Accordingly, the present invention has been made to solve the above problems. An object of the invention is to prevent an output of a pop noise through a speaker so that a user does not feel uncomfortable, which noise instantaneously occurs from an audio amplifier when a switch of an electronic device is turned on/off.

In order to achieve the above object, there is provided a circuit for preventing an output of a pop noise, the circuit comprising a switch for switching an electrical connection between an amplifier amplifying an audio signal and a speaker outputting the signal amplified by the amplifier; a power supply supplying a power to the amplifier; a controller outputting a control signal to control operations of the switch and the power supply; and a signal delay circuit delaying changes of operating states of the switch and the power supply in accordance with the control signal for a predetermined time, respectively.

According to a preferred embodiment of the invention, the controller may output a first control signal for changing the switch into a closed state and the power supply into an on-state, and a second control signal for changing the switch into an opened state and the power supply into an off-state.

According to a preferred embodiment of the invention, the signal delay circuit may comprise a RC delay circuit delaying the change of the operating state of the power supply in accordance with the output of the first control signal or the second control signal, for a time (t1) from a point of time that the first control signal or the second control signal is outputted; and a propagation delay circuit delaying the change of the switch into the closed state in accordance with the output of the first control signal, for a time (t2) from a point of time that the power supply is changed into the on-state, and delaying the change of the switch into the opened state in accordance with the output of the second control signal, for the time (t2) from a point of time that the second control signal is outputted, wherein the time (t2) may be shorter than the time (t1).

According to an embodiment of the invention, the RC delay circuit may comprise a first resistance and a first capacitor connected in parallel to the first resistance and the propagation delay circuit may comprise a second resistance and a second capacitor connected in parallel to the second resistance.

According to an embodiment of the invention, the time (t1) may be a time constant of the first resistance and the first capacitor.

According to an embodiment of the invention, the time (t2) may be a time constant of the second resistance and the second capacitor.

According to a preferred embodiment of the invention, the signal delay circuit may further comprise a transistor having a collector terminal respectively connected to an end of the RC delay circuit and an end of the propagation delay circuit and receiving the control signals via a base terminal thereof.

According to an embodiment of the invention, the signal delay circuit may further comprise a first diode connected to the collector terminal of the transistor at one end thereof and connected to the propagation delay circuit at the other end thereof; and a second diode connected to the power supply at one end thereof and connected to the propagation delay circuit at the other end thereof.

According to a preferred embodiment of the invention, when the transistor is turned on, the switch may be changed into the closed state from the opened state after the power supply is changed into the off-state from the on-state, and when the transistor is turned off, the power supply may be changed into the on-state from the off-state after the switch is changed into the opened state from the closed state.

According to an embodiment of the invention, a mobile communication terminal having a circuit for preventing an output of noise may be also provided.

According to an embodiment of the invention, an electronic device comprising a circuit for preventing the pop noise may be also provided.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description of the present invention, a detailed description of known functions and configurations incorporated herein will be omitted when it may make the subject matter of the present invention rather unclear.

Figure 1:
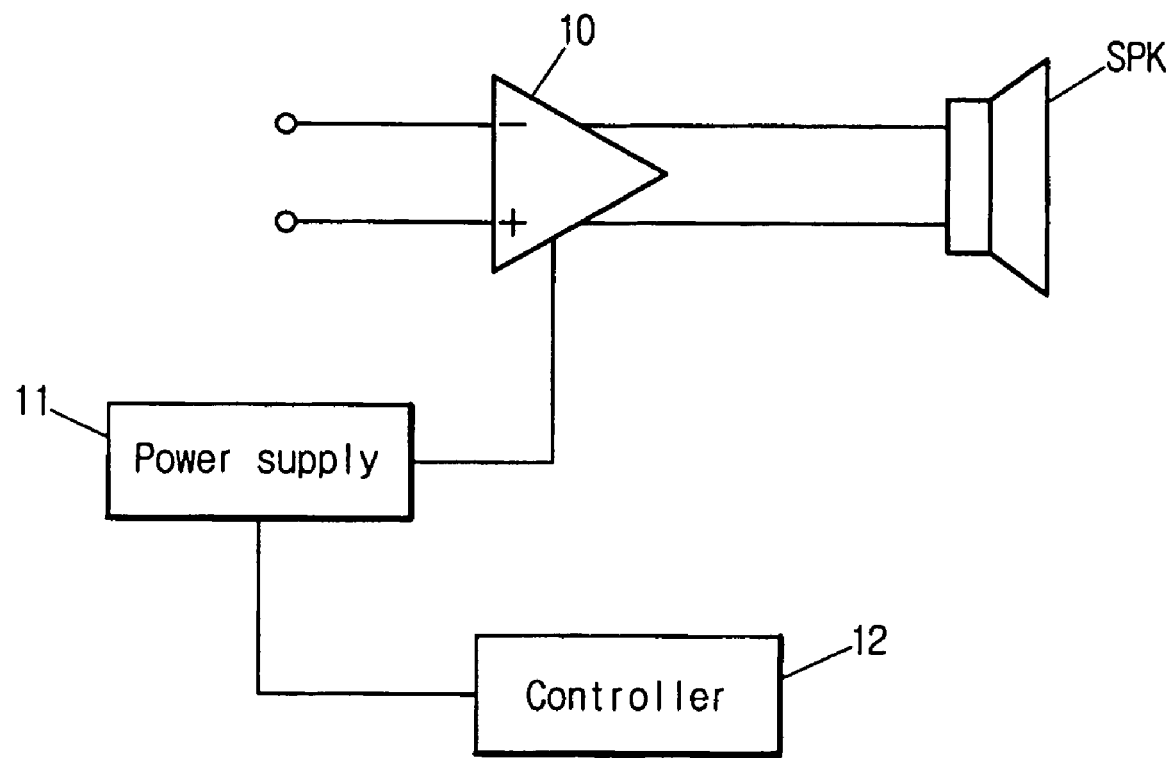
FIG. 1 shows a general audio output circuit provided to an electronic device.
Figure 2:
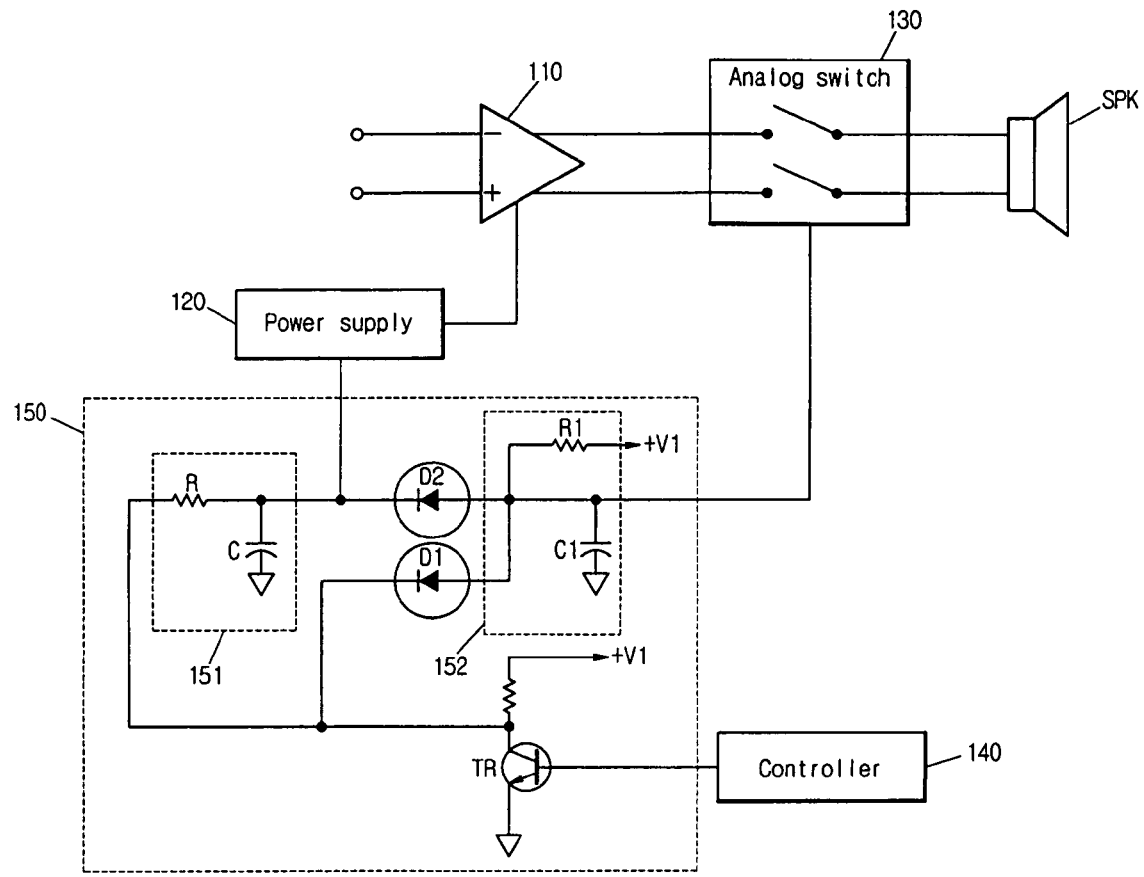
FIG. 2 shows a circuit for preventing an output of a pop noise according to an embodiment of the invention.

According to the invention, when an electronic device having an audio amplifier is turned on/off, it is intended to prevent an output of a pop noise through a speaker using a signal delay, which noise occurs from the audio amplifier, considering that the pop noise is instantaneous. As shown in FIG. 2, a circuit for preventing an output of a pop noise according to an embodiment of the invention may comprise an audio amplifier 110, a power supply 120, an analog switch 130, a controller 140 and a signal delay circuit 150.

The audio amplifier 110 receives an audio signal, amplifies the received signal to a predetermined level and outputs the amplified signal. The power supply 120 supplies a necessary power to the audio amplifier 110.

The analog switch 130 electrically connects the audio amplifier 110 and a speaker (SPK) each other or interrupts the electrical connection in accordance with on/off switching operations.

The controller 140 outputs a low-level control signal (first control signal) and a high-level control signal (second control signal) so as to control on/off operating states of the power supply 120 and opening/closing operating states of the analog switch 130. The output of the low-level or high-level control signal may be adjusted according to on/off states of a power switch (not shown).

The signal delay circuit 150 delays times that the operating states of the power supply 120 and the analog switch 130 are changed in accordance with the control signals outputted from the controller 140, respectively.

The signal delay circuit 150 may comprise a transistor TR, a RC delay circuit 151 and a propagation delay circuit 152. The transistor TR is connected to a signal output end of the controller 140 at a base terminal thereof and turned on/off as it receives the low-level or high-level control signal outputted from the controller 140.

The RC delay circuit 151 delays a voltage signal (+V1) to be transmitted to the power supply 120 for a predetermined time in accordance with turning on of the transistor TR.

The propagation delay circuit 152 propagation-delays the voltage signal (+V1) to be transmitted to the analog switch 130 so that the voltage signal (+V1) is transmitted to the analog switch 130 after the voltage signal (+V1) is transmitted to the power supply 120. In addition, when the transistor TR is turned off, the propagation delay circuit 152 delays an interruption of the voltage signal (+V1) being transmitted to the analog switch 130. At this time, it is structured such that the voltage signal (+V1) being transmitted to the analog switch 130 is first interrupted before the voltage signal (+V1) being transmitted to the power supply 120 is interrupted.

An emitter terminal of the transistor TR is connected to a ground and a collector terminal thereof is connected to a resistance R of the RC delay circuit 151 and a first diode D1. When the controller 140 connected to the base terminal of the transistor TR outputs a high-level control signal, the transistor TR is turned off to interrupt a transmission of the voltage signal (+V1) to the power supply 120 and the analog switch 130. When the transmission of the voltage signal (+V1) is interrupted, the power supply 120 becomes an off-state and the analog switch 130 becomes an opened state.

On the contrary, when the controller 140 outputs a low-level control signal, the transistor TR is turned on, so that the voltage signal (+V1) is transmitted to the power supply 120 and the analog switch 130. When the voltage signal (+V1) is transmitted, the power supply 120 becomes an on-state and the analog switch 130 becomes a closed state.

The RC delay circuit 151 is connected between the collector terminal of the transistor TR and the power supply 120 and delays the voltage signal (+V1) to be transmitted to the power supply 120 by a RC time constant of a parallel circuit of the resistance R and a capacitor C when the transistor TR is turned on. On the contrary, when the transistor TR is turned off, the RC delay circuit 151 interrupts the voltage signal (+V1) being transmitted to the power supply 120 after a delay time corresponding to the RC time constant.

The propagation delay circuit 152 is connected to the collector terminal of the transistor TR through a first diode D1 and connected to the power supply 120 through a second diode D2. When the transistor TR is turned on, the first diode D1 is off. After that, when the voltage signal (+V1) is transmitted to the power supply 120, the second diode D2 is off, so that the voltage signal (+V1) to be transmitted to the analog switch 130 is propagation-delayed by a R1C1 time constant of a parallel circuit of the resistance R1 and the capacitor C1.

On the contrary, when the transistor TR is turned off, the first diode D1 is on, the voltage signals (+V1) being transmitted to the power supply 120 and the analog switch 130 are respectively interrupted. In this case, the signal delay circuit 150 is structured such that the voltage signal (+V1) being transmitted to the analog switch 130 is first interrupted before the voltage signal (+V1) being transmitted to the power supply 120 is interrupted.

Figure 3:
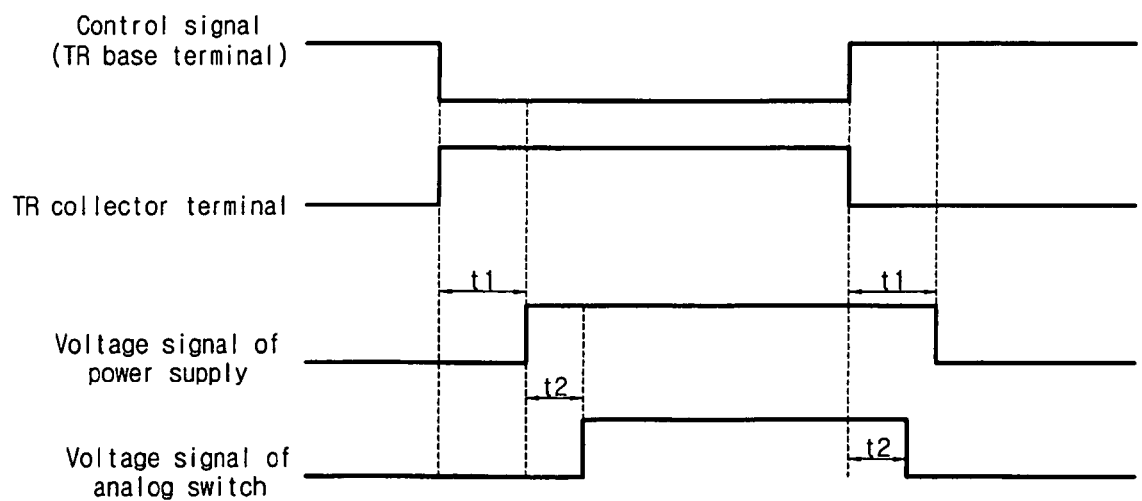
FIG. 3 is a signal timing diagram for illustrating an operation of a circuit for preventing an output of a pop noise according to an embodiment of the invention.

Hereinafter, an operation of the circuit for preventing an output of a pop noise having the above mentioned structure according to an embodiment of the invention will be described with reference to a circuit diagram of FIG. 2 and a signal timing diagram of FIG. 3.

When the controller 140 connected to the base terminal of the transistor TR outputs a low-level signal, the collector terminal of the transistor becomes a high-level state, so that the voltage signal (+V1) is transmitted to the power supply 120 and the analog switch 130.

Specifically, when the transistor TR is turned on by the low-level signal outputted from the controller 140, the voltage signal (+V1) flows to the collector of the transistor TR and the first diode D1 of the propagation delay circuit 152 is off, so that the voltage signal (+V1) is inputted to the RC delay circuit 151. At this time, the transmission of the voltage signal (+V1) to the power supply 120 is delayed due to the resistance R and the capacitor C of the RC delay circuit 151 by the RC time constant (t1).

Like this, when the voltage signal (+V1) is transmitted to the power supply 120 after the delay of the RC time constant (t1), the second diode D2 connected to the power supply 120 is off. Thereby, when all the first diode D1 and the second diode D2 of the propagation delay circuit 152 are off at an interval, the voltage signal (+V1) is transmitted to the analog switch 130. At this time, the transmission of the voltage signal (+V1) to the analog switch 130 is delayed by the R1C1 time constant (t2) due to the resistance R1 and the capacitor C1 of the propagation delay circuit 152. Accordingly, the analog switch 130 is changed into a closed state from an opened state after the delay time (t2) from a point of time that the voltage signal (+V1) is transmitted to the power supply 120. Therefore, even though the voltage signal (+V1) is transmitted to the power supply 120 and thus the pop noise occurs, the pop noise is not outputted to the speaker since the analog switch 130 has been already opened state at the time that the noise occurs.

On the contrary, when the controller 140 outputs the high-level signal, it is interrupted the transmission of the voltage signal (+V1) to the power supply 120 and the analog switch 130.

Specifically, when the transistor TR is turned on by the high-level signal outputted from the controller 140, the voltage signal (+V1) flows to the ground via the emitter terminal of the transistor TR, so that the first diode D1 connected to the collector terminal of the transistor TR becomes on-state and the voltage signal (+V1) being transmitted to the analog switch 130 is thus interrupted. At this time, the interruption of the voltage signal (+V1) is delayed by the R1C1 time constant (t2) due to the resistance R1 and the capacitor C1 of the propagation delay circuit 152. Accordingly, the analog switch 130 is opened after a delay time (t2) from a point of time that the voltage signal (+V1) is transmitted to the power supply 120, and after a total delay time (t1+t2) from a point of time that the high-level control signal is outputted from the controller 140.

In the mean time, the high-level control signal is outputted from the controller 140 to change the transistor TR to the off-state, and the voltage signal (+V1) being transmitted to the power supply 120 is interrupted after a delay time (t1) from a point of time that the high-level control signal is outputted from the controller 140, so that the power supply is changed into the off-state. As shown in FIG. 3, since the delay time (t1) is longer than the delay time (t2), the analog switch 130 is already in an opened state at the time that the power supply is off. Accordingly, even though the power supply is off and thus there occurs a pop noise, the pop noise is not outputted to the speaker since the analog switch 130 has already been changed to the opened state at the time that the pop noise occurs.

In this case, the delay time (t1) can be adjusted to be longer the delay time (t2) by adjusting the values of the resistance R and the capacitor C of the RC delay circuit 151 or the values of the resistance R1 and the capacitor C1 of the propagation delay circuit 152.

As described above, according to the invention, there is provided the signal delay circuit 150 capable of delaying the times that the operating states of the power supply 120 and the analog switch 130 are changed when the analog switch 130 and the power supply 120 are turned on/off. In addition, it is structured such that the analog switch 130 is under opened state at the time that the power supply 120 is on/off. Accordingly, it is possible to prevent the pop noise, which instantaneously occurs in the audio amplifier when the power switch is turned on/off, from being outputted through the speaker.

The above-described circuits of the present invention may be implemented in a variety of electronic device and a mobile communication terminal.

While the invention has been shown and described with reference to certain preferred embodiments thereof, it will be understood by those skilled in the art that various changes in form and details may be made thereto without departing from the spirit and scope of the invention as defined by the appended claims.

What is claimed is:

1. A circuit for preventing an output of a pop noise, the circuit comprising:
   a switch to switch an electrical connection between an amplifier amplifying an audio signal and a speaker outputting the signal amplified by the amplifier;
   a power supply to supply a power to the amplifier;
   a controller to output a first control signal and a second control signal to control operations of the switch and the power supply; and
   a signal delay circuit to delay changes of operating states of the switch and the power supply in accordance with the first control signal and the second control signal, for a predetermined time, respectively,
   wherein the signal delay circuit comprises:
   an RC delay circuit to delay the change of the operating state of the power supply for a time (t1) from a point of time that the first control signal is outputted; and
   a propagation delay circuit to delay the change of the switch to the closed state for a time (t2) from a point of time that the power supply is changed into the on-state.

2. The circuit according to claim 1, wherein the controller outputs the first control signal for changing the switch into a closed state and the power supply into an on-state, and the second control signal for changing the switch into an opened state and the power supply into an off-state.

3. The circuit according to claim 1, wherein
   the RC delay circuit delays the change of the operating state of the power supply for the time (t1) from a point of time that the second control signal is outputted; and
   the propagation delay circuit delays the change of the switch into the opened state in accordance with the output of the second control signal, for the time (t2) from a point of time that the second control signal is outputted,
   wherein the time (t2) is shorter than the time (t1).

4. The circuit according to claim 3, wherein the RC delay circuit comprises a first resistance and a first capacitor connected in parallel to the first resistance, and
   wherein the propagation delay circuit comprises a second resistance and a second capacitor connected in parallel to the second resistance.

5. The circuit according to claim 4, wherein the time (t1) is a time constant of the first resistance and the first capacitor.

6. The circuit according to claim 4, wherein the time (t2) is a time constant of the second resistance and the second capacitor.

7. The circuit according to claim 4, wherein the signal delay circuit further comprises a transistor having a collector terminal respectively connected to an end of the RC delay circuit and an end of the propagation delay circuit, the transistor to receive the control signals via a base terminal thereof.

8. The circuit according to claim 7, wherein the signal delay circuit further comprises:
   a first diode connected to the collector terminal of the transistor at one end thereof and connected to the propagation delay circuit at the other end thereof, and
   a second diode connected to the power supply at one end thereof and connected to the propagation delay circuit at the other end thereof.

9. The circuit according to claim 7, wherein when the transistor is turned on, the switch is changed into the closed state from the opened state after the power supply is changed into the off-state from the on-state, and when the transistor is turned off, the power supply is changed into the on-state from the off-state after the switch is changed into the opened state from the closed state.

10. A mobile communication terminal having a circuit for preventing an output of a pop noise, the circuit comprising:
   a switch to switch an electrical connection between an amplifier amplifying an audio signal and a speaker outputting the signal amplified by the amplifier;
   a power supply to supply a power to the amplifier;
   a controller to output a first control signal and a second control signal to control operations of the switch and the power supply; and
   a signal delay circuit to delay changes of operating states of the switch and the power supply in accordance with the first control signal and the second control signal, for a predetermined time, respectively,
   wherein the signal delay circuit comprises:
   an RC delay circuit to delay the change of the operating state of the power supply for a time (t1) from a point of time that the first control signal is outputted; and
   a propagation delay circuit to delay the change of the switch to the closed state for a time (t2) from a point of time that the power supply is changed into the on-state.

11. The mobile communication terminal according to claim 10, wherein the controller outputs the first control signal for changing the switch into a closed state and the power supply into an on-state, and the second control signal for changing the switch into an opened state and the power supply into an off-state.

12. The mobile communication terminal according to claim 10, wherein
   the RC delay circuit delays the change of the operating state of the power supply for the time (t1) from a point of time that the second control signal is outputted; and
   the propagation delay circuit delays the change of the switch into the opened state in accordance with the output of the second control signal, for the time (t2) from a point of time that the second control signal is outputted, wherein the time (t2) is shorter than the time (t1).

13. The mobile communication terminal according to claim 12, wherein the RC delay circuit comprises a first resistance and a first capacitor connected in parallel to the first resistance, and
   wherein the propagation delay circuit comprises a second resistance and a second capacitor connected in parallel to the second resistance.

14. The mobile communication terminal according to claim 13, wherein the time (t1) is a time constant of the first resistance and the first capacitor.

15. The mobile communication terminal according to claim 13, wherein the time (t2) is a time constant of the second resistance and the second capacitor.

16. The mobile communication terminal according to claim 13, wherein the signal delay circuit further comprises a transistor having a collector terminal respectively connected to an end of the RC delay circuit and an end of the propagation delay circuit, the transistor to receive the control signals via a base terminal thereof.

17. The mobile communication terminal according to claim 16, wherein the signal delay circuit further comprises:
   a first diode connected to the collector terminal of the transistor at one end thereof and connected to the propagation delay circuit at the other end thereof; and
   a second diode connected to the power supply at one end thereof and connected to the propagation delay circuit at the other end thereof.

18. The mobile communication terminal according to claim 16, wherein when the transistor is turned on, the switch is changed into the closed state from the opened state after the power supply is changed into the off-state from the on-state, and when the transistor is turned off, the power supply is changed into the on-state from the off-state after the switch is changed into the opened state from the closed state.

19. An electronic device comprising the circuit for preventing the pop noise according to claim 1.

\* \* \* \* \*